United States Patent
Wu et al.

(10) Patent No.: US 7,952,436 B2
(45) Date of Patent: May 31, 2011

(54) PHASE LOCK LOOP CIRCUIT

(75) Inventors: Li-Te Wu, Taipei (TW); Cheng-Feng Shih, Taoyuan County (TW)

(73) Assignee: Fortemedia, Inc., Cupertino, CA (US)

( * ) Notice: Subject to any disclaimer, the term of this patent is extended or adjusted under 35 U.S.C. 154(b) by 63 days.

(21) Appl. No.: 12/489,637

(22) Filed: Jun. 23, 2009

(65) Prior Publication Data

US 2010/0321119 A1    Dec. 23, 2010

(51) Int. Cl.
*H03L 7/00* (2006.01)

(52) U.S. Cl. ............. 331/16; 331/179; 331/34; 331/1 A; 327/156; 327/159

(58) Field of Classification Search .................. 331/179, 331/16, 34, 1 A; 327/156, 159
See application file for complete search history.

(56) References Cited

U.S. PATENT DOCUMENTS

| | | | |
|---|---|---|---|
| 6,724,265 B2 * | 4/2004 | Humphreys | 331/17 |
| 6,911,868 B1 * | 6/2005 | Kumar DVJ | 331/16 |
| 7,106,141 B2 * | 9/2006 | Puma | 331/16 |

* cited by examiner

*Primary Examiner* — Arnold Kinkead
(74) *Attorney, Agent, or Firm* — Thomas|Kayden

(57) ABSTRACT

A phase lock loop (PLL) circuit is provided. A voltage controlled oscillator (VCO) generates an output clock signal based on a control voltage. A controller provides a first digital control word, a second digital control word and a loop factor. A frequency modifier is coupled to the output clock signal, controlled by the controller to divide the output clock signal by the loop factor to generate a feedback frequency. A charge pump is controlled by the up signal and down signal to generate a charge pump current, comprising a first digital to analog converter (DAC) to generate a first current based on the first digital control word when the up signal is asserted. A second DAC generates a second current based on a second digital control word when the down signal is asserted. The controller defines a first relationship between the first digital control word and the loop factor, and the controller defines a second relationship between the second digital control word and the loop factor.

6 Claims, 4 Drawing Sheets

PHASE LOCK LOOP CIRCUIT

BACKGROUND OF THE INVENTION

1. Field of the Invention

The invention relates to a phase lock loop, and in particular, to programmable loop gain factors to enhance the working range.

2. Description of the Related Art

A Phase lock loop (PLL) circuit is widely used in the communication area for the purpose of clock synchronous and clock synthesis. PLL is a kind of feedback control circuit. All feedback circuit should be designed carefully to make sure that the whole circuit is stable. If the circuit is unstable, the output clock frequency would vary periodically.

FIG. 1 shows a general block diagram of the phase locked loop (PLL), comprising a phase detector 102, a charge pump 104, a low pass filter (LPF) 106, a voltage controlled oscillator (VCO) 108 and a frequency modifier 110. A reference frequency $f_{ref}$ is provided to the phase detector 102 as an initial condition. The phase detector 102 typically has two input terminals and two output terminals. The phases of the reference frequency $f_{ref}$ and a feedback frequency c are compared by the phase detector 102 to output either an up signal $V_{UP}$ or a down signal $V_{DOWN}$. For example, rising edges of the reference frequency $f_{ref}$ and feedback frequency $f_{back}$ are compared. An up signal $V_{UP}$ is asserted when the rising edge of the reference frequency $f_{ref}$ is detected while that of the feedback frequency $f_{back}$ is not. The up signal $V_{UP}$ will hold high until the rising edge of the feedback frequency $f_{back}$ is detected. Conversely, down signal $V_{DOWN}$ is asserted when the rising edge of the feedback frequency $f_{back}$ is detected while that of the reference frequency $f_{ref}$ is not. Likewise, down signal $V_{DOWN}$ will hold high until the rising edge of the reference frequency $f_{ref}$ is detected.

The charge pump 104 typically comprises a current source to pull or drain a current based on the up signal $V_{UP}$ and down signal $V_{DOWN}$, such that a control voltage $V_f$ is generated at the output end of the LPF 106.

The VCO 108 then generates an output clock signal $f_{out}$ based on the control voltage $V_f$ output from the LPF 106. The frequency of the output clock signal $f_{out}$ can be expressed as:

$$f_{out}=K*V_f \quad (1),$$

where K is a constant. This equation implies that the output clock frequency of the VCO 108 is proportional to the input voltage of it. The output clock signal $f_{out}$ is also fed back to the frequency modifier 110. The frequency modifier 110 performs a frequency division to generate a feedback frequency $f_{back}$ having a frequency expressed as:

$$f_{back}=f_{out}/M \quad (2),$$

where M is a loop factor equal or greater than 1. Consequently, a close loop is formed, and the PLL 100 is expected to be recursively converged to lock on a desired frequency. Parameters of the components within the PLL must be carefully designed to exhibit stability and effective convergence characteristics. Generally, a unity loop gain is desired for the loop to converge to a stable condition. The loop factor M is usually adjustable to increase the flexibility of PLL such that a wide range of desired frequency can by dynamically rendered. However, the loop factor M is inverse proportional to the loop gain of the PLL. When the loop factor M is adjusted, the loop gain may be biased away from unity, and stability of the loop is influenced, causing the convergence time undeterminable. It is possible that an inappropriate loop factor M would cause the PLL to oscillate, diverge, or converge slow.

As the PLL is usually an essential component in communication systems, it is desirable to implement an enhanced design to overcome the loop gain issue.

BRIEF SUMMARY OF THE INVENTION

An exemplary embodiment of a phase lock loop (PLL) circuit is provided. A voltage controlled oscillator (VCO) generates an output clock signal based on a control voltage. A controller provides a first digital control word, a second digital control word and a loop factor. A frequency modifier is coupled to the output clock signal, controlled by the controller to divide the output clock signal by the loop factor to generate a feedback frequency. A phase detector has a first input end for receiving a reference frequency, and a second end coupled to the feedback frequency, and compares phases of the reference frequency and the feedback frequency to assert an up signal or a down signal. A charge pump is controlled by the up signal and down signal to generate a charge pump current. In the charge pump, a first digital to analog converter (DAC) is operative to generate a first current based on the first digital control word when the up signal is asserted. A second DAC is operative to generate a second current based on a second digital control word when the down signal is asserted. The first current and the second current are output as the charge pump current. A low pass filter (LPF) is coupled to the charge pump current, performing a low pass filtering on the charge pump current to output the control voltage. The controller defines a first relationship between the first digital control word and the loop factor, and the controller defines a second relationship between the second digital control word and the loop factor.

The first relationship and the second relationship may be linear non-decreasing functions. Alternatively, the first and second relationships may be non-decreasing stepwise functions.

The first digital control word and second digital control word may be different digital control words. The first DAC generates the first current based on a unit current multiplying the first digital control word, and the second DAC generates the second current based on the unit current multiplying the second digital control word.

In a further embodiment, the first digital control word and second digital control word are identical to the loop factor. A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
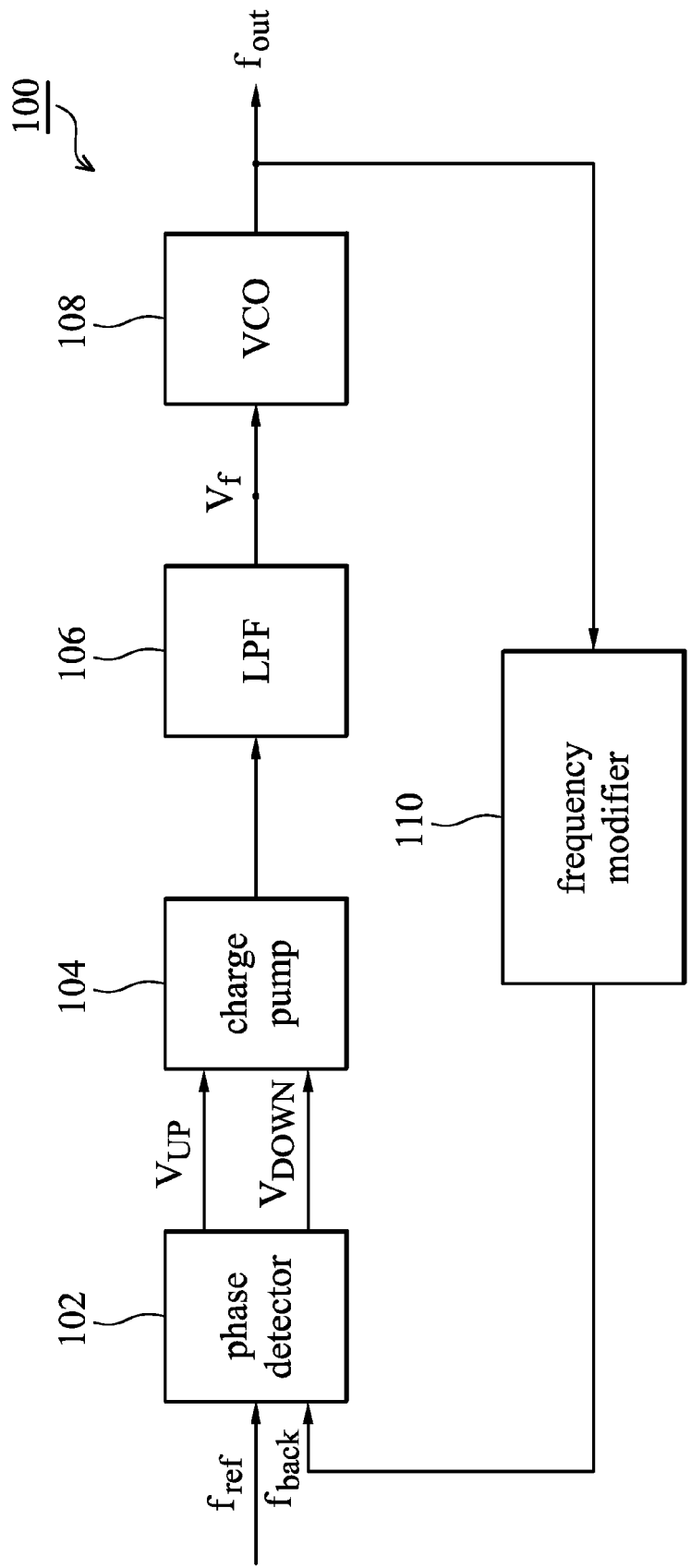
FIG. 1 shows a conventional PLL circuit.
Figure 2:
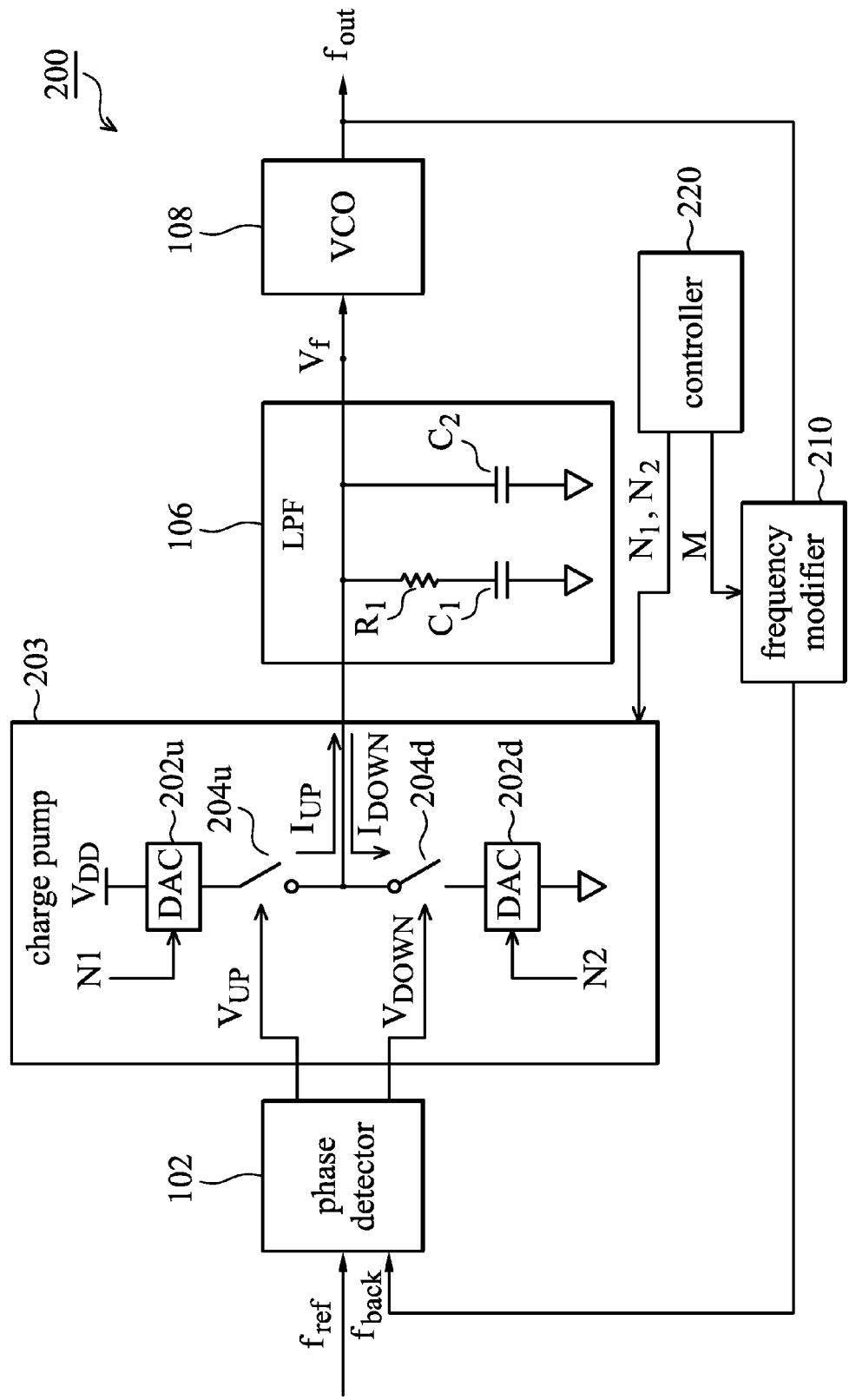
FIG. 2 shows an embodiment of a PLL circuit 200.

FIG. 2 shows an embodiment of a PLL circuit 200. A charge pump 230 is provided to replace the conventional charge pump 104 of FIG. 1. In the charge pump 230, a first DAC 202u and a second DAC 202d are provided, each controlled by a first digital control word N1 and a second digital control word N2 to provide desired currents. The first digital control word N1 and second digital control word N2 are digital control words determined by a controller 220 based on various parameters of the PLL circuit 200, and detailed calculation thereof will be described below. The frequency modifier 210 is a programmable divider for dividing the output clock signal $f_{out}$ to generate the feedback frequency $f_{back}$. The controller 220 provides a loop factor M to the frequency modifier 210 as a basis to determine the output clock signal $f_{out}$. Since the frequency modifier 210 is programmable, the PLL circuit 200 is operative to provide an output clock signals $f_{out}$ of wide frequency range. For example, a higher loop factor M would render a higher output clock signal $f_{out}$, and vise versa.

As the PLL circuit 200 is initialized, the phase detector 102 compares phases of the reference frequency $f_{ref}$ and the feedback frequency $f_{back}$. An up signal $V_{UP}$ is asserted if the phase of reference frequency $f_{ref}$ leads that of the feedback frequency $f_{back}$. Conversely, down signal $V_{DOWN}$ is asserted if the phase of feedback frequency $f_{back}$ leads that of the reference frequency $f_{ref}$. The asserted up signal $V_{UP}$ would switch on the first switch 204u, allowing the first DAC 202u to inject a first current $I_{UP}$ to the LPF 106. The first DAC 202u is digitally controlled by the first digital control word N1. For example, there may be a plurality of current mirrors each corresponding to a digit value (not shown), and the first digital control word N1 has a plurality of digits each enabling a corresponding current mirror to provide currents. Consequently, the total current output from the first DAC 202u forms the first current $I_{UP}$. Likewise, the second DAC 202d and the second digital control word N2 are of identical design, and when the down signal $V_{DOWN}$ switches on the second switch 204d, a second current $I_{DOWN}$ is drained from the LPF 106. When neither the up signal $V_{UP}$ nor down signal $V_{DOWN}$ are asserted, the charge pump 230 turns into a floating state, wherein no current is generated. In the embodiment, the LPF 106 comprises a string of a first resistor R1 and a first capacitor C1 cascaded with a second capacitor C2 in parallel, coupled to the output end of the charge pump 230 to provide the control voltage $V_f$.

The stability is the major design concern while designing PLL. The transfer function of each functional block should be studied before analyzing the system stability.

The transfer function of the frequency modifier 210 is:

$$TF_{210} = \frac{\text{Phase}(f_{back})}{\text{Phase}(f_{out})} = \frac{\text{Frequency}(f_{back})}{\text{Frequency}(f_{out})} = \frac{1}{M}, \quad (3)$$

The transfer function of the phase detector 102 and charge pump 230 is:

$$TF_{102} = \frac{I_{CP}}{\text{Phase}(f_{ref}) - \text{Phase}(f_{back})} = \frac{I_{CP}}{2\pi}, \quad (4)$$

where the charge pump current $I_{CP}$ represents the current flowing from the charge pump 230 to the LPF 106.

The transfer function of the LPF 106 is:

$$TF_{106} = \frac{V_f}{I_{cp}} = \frac{(1 + sC_1R_1)}{s(C_1 + C_2)(1 + sC_TR_1)} \quad (5)$$

where $C_T = \frac{C_1 C_2}{C_1 + C_2}$,

The transfer function of the VCO 108 is:

$$TF_{108} = \frac{\text{Phase}(f_{out})}{V_f} = 2\pi \frac{K_{VCO}}{s}, \quad (6)$$

Therefore, an open loop transfer function from reference frequency $f_{ref}$ to output clock signal $f_{out}$ can be estimated from equations (3) to (6):

$$A = TF_{open} \quad (7)$$
$$\equiv \frac{\text{Phase}(f_{out})}{\text{Phase}(f_{ref})}$$
$$= TF_{102} \cdot TF_{106} \cdot TF_{108}$$
$$= \frac{I_{CP} \cdot K_{VCO}}{(C_1 + C_2)} \cdot \frac{(1 + sC_1R_1)}{s^2(1 + sC_TR_1)},$$

A feedback factor $\beta$ is expressed as:

$$\beta \equiv \frac{\text{Phase}(f_{back})}{\text{Phase}(f_{out})} = \frac{1}{M}, \quad (8)$$

The loop gain of the PLL is therefore calculated from equations (7) and (8):

$$G_{Loop} = a\beta = \frac{I_{CP} \cdot K_{VCO}}{M \cdot (C_1 + C_2)} \cdot \frac{(1 + sC_1R_1)}{s^2(1 + sC_TR_1)}, \quad (9)$$

The above equation shows that there are three pole frequencies and one zero frequency in the loop gain. The first two poles are at DC, and the third pole frequency $f_{P3}$ is shown as:

$$f_{P3} = \frac{1}{2\pi C_T R_1}, \quad (10)$$

The zero frequency $f_Z$ is shown as:

$$f_Z = \frac{1}{2\pi C_1 R_1}, \quad (11)$$

Figure 3A:
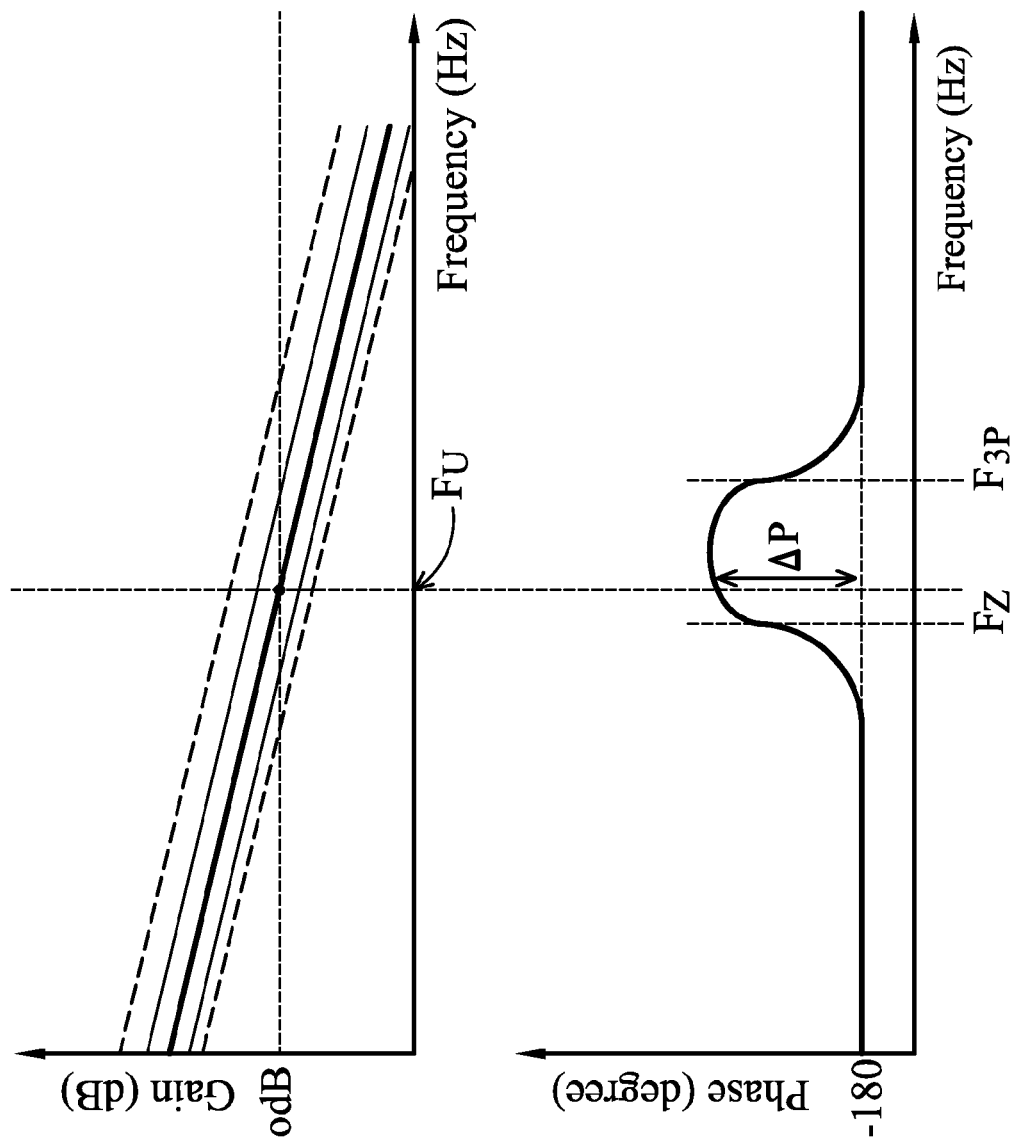
FIGS. 3a and 3b show transfer functions of different loop factors.

FIG. 3a show transfer functions of the phase locked loop. The upper part is a gain response in frequency domain. The X-axis is the frequency in log scale and the Y-axis is the magnitude of loop gain $G_{LOOP}$ in dB unit. The frequency where the magnitude of the loop-gain is equal to 0 dB is called unity gain frequency $F_u$. The lower part of FIG. 3a shows a phase response of the loop gain in frequency domain. The phase difference between phase at unity gain frequency $F_u$ and −180 degrees (shown as P) is called phase margin.

To design a stable PLL, the phase margin is preferably between 60° and 75°. From FIG. 3a, the phase margin at pole 3 frequency $f_{P3}$ or zero frequency $f_Z$ is subsequently 45°. In other words, a unity gain would be acquired while the operating frequency of the PLL circuit 200 is higher than zero frequency $f_Z*2.5$, and lower than the pole 3 frequency $F_U/2.5$. Meanwhile, experiments have taught that the optimal condition would be acquired when the ratio of pole 3 frequency and zero frequency $f_{P3}/f_Z$ is around 25. It turns out that the unity gain frequency $f_U$ can be denoted as $f_Z*Y$, where Y=2.5~10. That is, a theoretically stable system can only generate a maximum $f_U$ of at most up to 4 times a minimum $f_U$.

From previous discussion, zero frequency $f_Z$ is defined by the resistance of the first resistor R1 and the first capacitor C1. It is independent on the reference frequency $f_{ref}$ or the output clock signal $f_{out}$. Parameters to determine the unity gain frequency $f_U$ may include: The current charge pump current $I_{CP}$, the gain $K_{VCO}$ of the VCO 108, the capacitances $(C_1+C_2)$ in the LPF 106, the loop factor M, the Pole 3 frequency $f_{P3}$, and the zero frequency $f_Z$.

The output clock signal $f_{out}$ in most of system is regulated to be a constant. For example, most of the output clock signal $f_{out}$ in computer sound card is 24.576 MHz. In this view, the loop gain $G_{LOOP}$ can be re-written as:

$$G_{Loop} = A\beta = \frac{f_{ref}}{f_{out}} \cdot \frac{I_{CP} \cdot K_{VCO}}{(C_1+C_2)} \cdot \frac{(1+sC_1R_1)}{s^2(1+sC_TR_1)}, \quad (12)$$

Thus, the unity gain frequency $f_U$ of the loop gain is proportional to reference frequency $f_{ref}$. In real system, the reference frequency $f_{ref}$ generally ranges from 1 MHz to 66 MHz, however, the frequency range is suggested to be at most 4 (Maximum $f_U$/minimum $f_U$<=4) for stability concern. Therefore, the stability consideration severely restricts the allowable range of the reference frequency $f_{ref}$.

The embodiment of FIG. 2 modifies the charge pump 230 to provide better flexibility, in which a first digital control word N1 and a second digital control word N2 are provided to control the first current $I_{UP}$ and second current $I_{DOWN}$, respectively. The first DAC 202u and second DAC 202d may output a multiple of a unity current $I_X$ based on the first digital control word N1 and second digital control word N2. For example, the first current $I_{UP}$ output from the first DAC 202u may be:

$$I_{up}=N_1 \cdot I_x \quad (13)$$

$$I_{down}=N_2 \cdot I_x \quad (14)$$

where $I_X$ is a unit current provided by the first DAC 202u and second DAC 202d. In an example, the first digital control word N1 and second digital control word N2 can be selected to be identical to the loop factor M (N1=N2=M), thereby the magnitudes of the first current $I_{UP}$ and second current $I_{DOWN}$ are identical but the directions are inversed. Consequently, the magnitudes of the first current $I_{UP}$ and second current $I_{DOWN}$ are proportional to the loop factor M. That is, the charge pump current $I_{CP}=M*I_X$. Therefore the transfer function of the phase detector 102 and the charge pump 230 is rewritten as:

$$TF_{102} = \frac{I_{CP}}{\text{Phase}(f_{ref}) - \text{Phase}(f_{back})} = \frac{I_{CP}}{2\pi} = \frac{M \cdot I_X}{2\pi}, \quad (15)$$

and the loop gain is rewritten as:

$$G_{Loop} = A\beta \quad (16)$$

$$= \frac{1}{M} \cdot \frac{MI_X \cdot K_{VCO}}{(C_1+C_2)} \cdot \frac{(1+sC_1R_1)}{s^2(1+sC_TR_1)}$$

$$= \frac{I_X \cdot K_{VCO}}{(C_1+C_2)} \cdot \frac{(1+sC_1R_1)}{s^2(1+sC_TR_1)}$$

As shown in equation (16), the dependency of loop factor M is eliminated from the loop gain $G_{LOOP}$. Thereby, a more flexibly adjustment can be made on the loop factor M without affecting the phase margin. Preferably, the unit current $I_X$ can be selected to acquire a unity gain frequency $f_U$:

$$F_U = \sqrt{F_Z \cdot F_{P3}} \quad (17),$$

and such a configuration allows the PLL circuit 200 to operate with a phase margin of desirable range.

Through configuration of the first digital control word N1 and second digital control word N2, the consequences caused by loop gain offset can be is compensated. Nevertheless, the first digital control word N1 and second digital control word N2 do not need to be identical to the loop factor M. In another embodiment, the first digital control word N1 and second digital control word N2 are independently adjusted with a linear or non-linear function of the loop factor M. For example, a non-decreasing linear function such as Y=ax+b (a>0) or Y=ax²+bx+c (a>0) can be implemented in the controller 220 to calculate the digital control words N1 and N2 by substituting the loop factor M as the x. A stepwise function is also adaptable. For example, when the loop factor M is within a first range, the digital control words N1 and N2 are designated to a first value. Meanwhile, when the loop factor is within a second range, the N1 and N2 are a second value. The stepwise function is preferably non-decreasing, too. That is, the second range is no less than the first range, while the second value is no less than the first value.

Figure 3B:
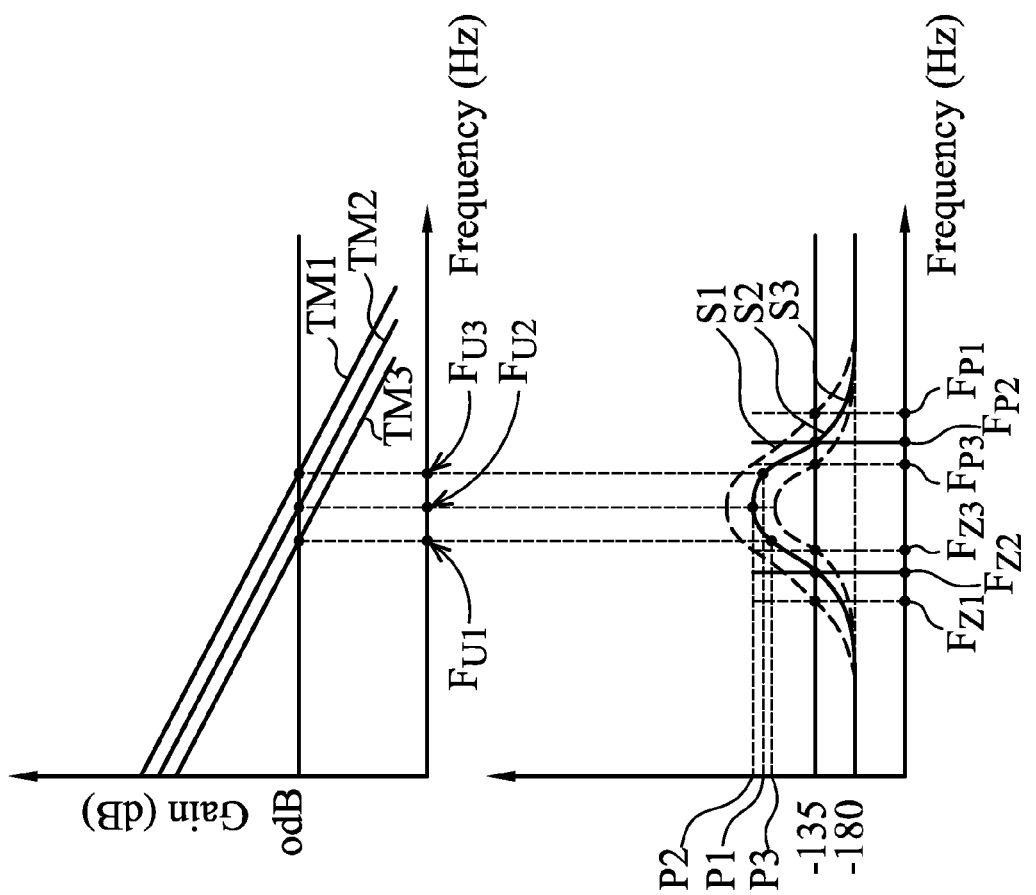

FIG. 3b shows an alternative embodiment of the transfer functions. In the upper part of FIG. 3b, three gain responses TM1, TM2 and TM3 are presented, each corresponding to a different loop factor M. The desired unity frequencies are therefore fixed on different points, such as $f_{U1}$, $f_{U2}$ and $f_{U3}$, respectively. In the lower part of FIG. 3b, various phase responses S1, S2 and S3 are presented, each characterized with different zero frequencies (i.e. $f_{Z1}$, $f_{Z2}$, $f_{Z3}$) and pole frequencies (i.e. $f_{P1}$, $f_{P2}$, $f_{P3}$). The phase responses S1, S2 and S3 can be characterized by providing different first digital control word N1 and second digital control word N2, thus the of the unity gain frequencies $f_{U1}$, $f_{U2}$ and $f_{U3}$ can be flexibly supported by appropriately selected phase margins, such as the phase margins counted from the points P1, P2 and P3.

Since the transfer function of the PLL circuit 200 can be compensated to avoid loop gain deviation, the reference frequency $f_{ref}$ can be provided with a wider range than the prior arts.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase lock loop (PLL) circuit, comprising:
a voltage controlled oscillator (VCO), for generating an output clock signal based on a control voltage;
a controller, for providing a first digital control word, a second digital control word and a loop factor;
a frequency modifier, coupled to the output clock signal, controlled by the controller to divide the output clock signal by the loop factor to generate a feedback frequency;
a phase detector, having a first input end for receiving a reference frequency, and a second end coupled to the feedback frequency, and comparing phases of the reference frequency and the feedback frequency to assert an up signal or a down signal;
a charge pump, controlled by the up signal and down signal to generate a charge pump current, comprising:
a first digital to analog converter (DAC), operative to generate a first current based on the first digital control word when the up signal is asserted; and
a second DAC, operative to generate a second current based on a second digital control word when the down signal is asserted; wherein the first current and the second current are output as the charge pump current;
a low pass filter (LPF), coupled to the charge pump current, performing a low pass filtering on the charge pump current to output the control voltage; wherein:
the controller defines a first relationship between the first digital control word and the loop factor; and
the controller defines a second relationship between the second digital control word and the loop factor, wherein the first relationship and the second relationship are linear non-decreasing functions.

2. The phase lock loop circuit as claimed in claim 1, wherein:
the first digital control word and second digital control word are different digital control words;
the first DAC generates the first current based on a unit current multiplying the first digital control word; and
the second DAC generates the second current based on the unit current multiplying the second digital control word.

3. The phase lock loop circuit as claimed in claim 1, wherein the first digital control word and second digital control word are identical to the loop factor.

4. A phase lock loop (PLL) circuit, comprising:
a voltage controlled oscillator (VCO), for generating an output clock signal based on a control voltage;
a controller, for providing a first digital control word, a second digital control word and a loop factor;
a frequency modifier, coupled to the output clock signal, controlled by the controller to divide the output clock signal by the loop factor to generate a feedback frequency;
a phase detector, having a first input end for receiving a reference frequency, and a second end coupled to the feedback frequency, and comparing phases of the reference frequency and the feedback frequency to assert an up signal or a down signal;
a charge pump, controlled by the up signal and down signal to generate a charge pump current, comprising:
a first digital to analog converter (DAC), operative to generate a first current based on the first digital control word when the up signal is asserted; and
a second DAC, operative to generate a second current based on a second digital control word when the down signal is asserted; wherein the first current and the second current are output as the charge pump current;
a low pass filter (LPF), coupled to the charge pump current, performing a low pass filtering on the charge pump current to output the control voltage; wherein:
the controller defines a first relationship between the first digital control word and the loop factor; and
the controller defines a second relationship between the second digital control word and the loop factor, wherein the first and second relationships are non-decreasing stepwise functions.

5. The phase lock loop circuit as claimed in claim 4, wherein:
the first digital control word and second digital control word are different digital control words;
the first DAC generates the first current based on a unit current multiplying the first digital control word; and
the second DAC generates the second current based on the unit current multiplying the second digital control word.

6. The phase lock loop circuit as claimed in claim 4, wherein the first digital control word and second digital control word are identical to the loop factor.

* * * * *